United States Patent [19]

Banerjee

[11] Patent Number: 4,864,374
[45] Date of Patent: Sep. 5, 1989

[54] TWO-TRANSISTOR DRAM CELL WITH HIGH ALPHA PARTICLE IMMUNITY

[75] Inventor: Sanjay K. Banerjee, Austin, Tex.

[73] Assignee: Texas Instruments Incorporated, Dallas, Tex.

[21] Appl. No.: 126,455

[22] Filed: Nov. 30, 1987

[51] Int. Cl.[4] .................. H01L 29/78; H01L 29/06; H01L 27/02; G11C 11/34
[52] U.S. Cl. .................. 357/23.6; 357/55; 357/41; 365/185
[58] Field of Search .................. 357/23.6, 55, 41; 365/185

[56] References Cited

U.S. PATENT DOCUMENTS

| | | | |
|---|---|---|---|
| 4,432,006 | 2/1984 | Takei | 357/23.6 |
| 4,448,400 | 5/1984 | Harari | 357/23.6 |
| 4,716,548 | 12/1987 | Mochizuki | 357/55 |
| 4,763,181 | 8/1988 | Tasch, Jr. | 357/23.6 |

FOREIGN PATENT DOCUMENTS 0202515 11/1986 European Pat. Off. ........... 357/23.6

OTHER PUBLICATIONS

Shichijo et al., "TITE RAM: A New SOI DRAM Gain Cell for Mbit DRAM's", Extended Abstracts of the 16th (1984 International) Conference on Solid State Devices and Materials, Kobe, 1984, pp. 265-268.

Primary Examiner—Rolf Hille
Assistant Examiner—Robert P. Limanek
Attorney, Agent, or Firm—Larry C. Schroeder; Rodney M. Anderson; Melvin Sharp

[57] ABSTRACT

A DRAM cell (8) having a storage node (18), a pass transistor (76) and a polysilicon word line (84) formed within an oxide isolated trench (68), thereby providing high soft error immunity. A write bit line (66) functions as the drain region (78) of the pass transistor (76) and is isolated from the substrate by a oxide isolation (64), thereby enhancing soft error immunity. The trench (68) includes an annular opening for providing intimate contact between the past transistor conduction channel (82) and the single crystal silicon substrate (36). During processing, the polysilicon conduction channel (82) of the pass transistor (76) is converted into single crystal silicon, thereby providing enhanced performance of the cell (8).

9 Claims, 3 Drawing Sheets

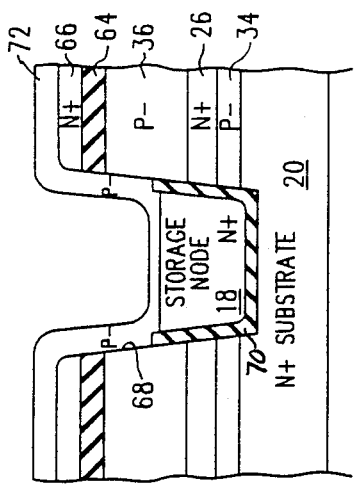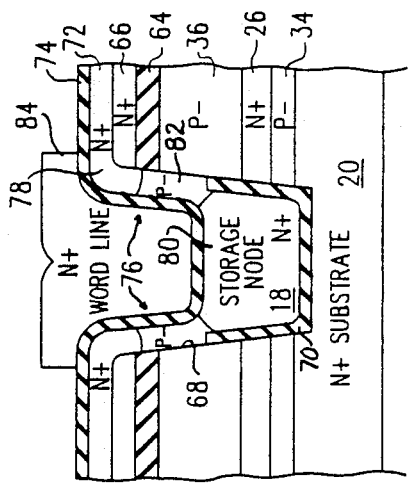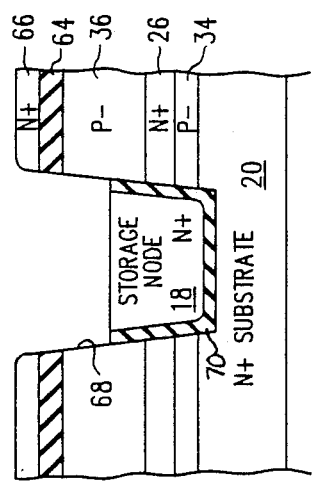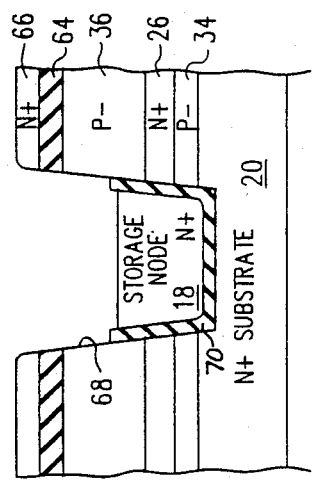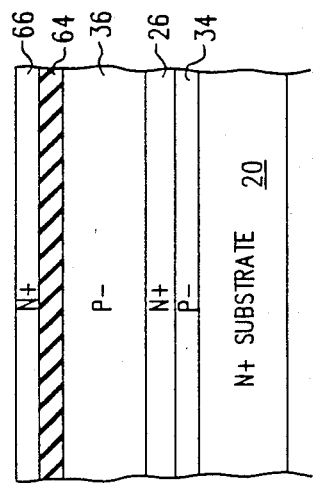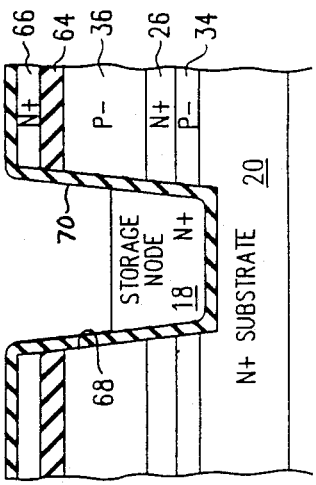

TWO-TRANSISTOR DRAM CELL WITH HIGH ALPHA PARTICLE IMMUNITY

RELATED APPLICATION "Trench Dram Cell With Dynamic Gain", by Sanjay K. Banerjee, filed concurrently herewith, Ser. No. 126,523.

TECHNICAL FIELD OF THE INVENTION

The present invention relates in general to semiconductor memories, and more particularly to dynamic random access memories and methods of fabrication thereof.

BACKGROUND OF THE INVENTION

The development of dynamic random access memories (DRAMs) has made possible the storage capability of over four million bits in a single integrated circuit chip. The packing density of the cells of such memories has been optimized by reducing the area of components comprising each cell. Typically, MOS DRAM cells include a single transistor and a single capacitor for storing the electrical charge corresponding to a logic high or low level. With such a construction, each cell of the memory array is required to be periodically refreshed so as to maintain the logic level stored on the cell capacitor.

MOS memory arrays can be made smaller in size by scaling the entire array, i.e., reducing the size of each component or feature of the array. This, however, has reached a limiting point, in that with small storage capacitors the charge storage capability is reduced, and thus the electrical signal output therefrom becomes difficult to distinguish from noise and other electrical interference normally found in the array. Hence, complex sense amplifiers are required to distinguish the readout signal from the noise signals.

In view of the inherent limitations which accompany the one-transistor DRAM cell, a new type of DRAM cell, with dynamic gain, has been proposed. The construction and operation of one such DRAM cell is disclosed in the technical article "TITE RAM: A New SOI DRAM Gain Cell For Mbit DRAM's", 16th International Conference on Solid State Devices and Materials, 1984, pp. 265–268, S. Banerjee et al. Disclosed in the article is a planar two-transistor DRAM cell employing a pass transistor during write operations to couple the charge from a write bit line to the small area storage capacitor. The word line capacitance associated with the cell is capacitively coupled to the storage capacitor, thereby forming a capacitor divider. When the word line is driven during read operations of the cell, the voltage on the storage node is boosted to a voltage depending on the charge stored thereon. The capacitor forms a part of a gain transistor which is adapted to connect a voltage source to a read bit line. If little or no charge is stored on the capacitor, the boosted voltage on the storage capacitor is insufficient to turn on the gain transistor strongly, whereby a precharged voltage existing on the read bit line is not significantly disturbed. However, if a substantial charge has been stored on the storage capacitor, the boosted voltage during read operations is sufficient to drive the gain transistor into heavy conduction, thereby placing a substantial charge on the read bit line.

While the two-transistor DRAM cell provides an internal readout gain not found in the one-transistor cell, several shortcomings are still inherent with the cell. First, two write word lines are required for accessing the cell. A write word line is utilized during write operations, while a read word line is utilized during a read operation of the cell. The need for additional access circuits and fabrication steps are apparent. In addition, the pass transistor of such a two-transistor DRAM cell is most efficiently fabricated using polycrystalline silicon (polysilicon). Such type of transistor is inherently leaky, and thus needs to be refreshed more frequently.

From the foregoing, it can seen that a need exists for an improved gain-type DRAM cell which can be efficiently made employing trench techniques, but which exhibits a substantially higher soft error immunity to the effects of alpha particles. An associated need exists for a gain-type DRAM cell which can be constructed with a high quality pass transistor to thereby improve the performance of such cell.

SUMMARY OF THE INVENTION

In accordance with the present invention, an improved gain-type DRAM cell, and method of fabrication thereof, is disclosed which reduces or substantially eliminates the disadvantages and shortcomings associated with the prior DRAM cells. According to the invention, a gain-type DRAM cell is disclosed having a high immunity to electrical disturbances caused by alpha particles, and a high quality pass transistor for improved performance.

In accordance with the preferred embodiment of the invention, numerous alternating N and P-type semiconductor layers are formed on a substrate to define regions of a vertical gain transistor and an associated buried read bit line. A write bit line is insulated from the layered substrate and thus is immune from electrical activity caused by alpha particle strikes in the substrate. The transistors are constructed on trench sidewalls as vertical devices such that the gain transistor is a high speed device with a relatively high threshold voltage. On the other hand, the pass transistor is constructed within the trench and exhibits a slower response and a lower threshold voltage. By employing a high quality epitaxial semiconductor substrate layers, the gain transistor can be fabricated to exhibit high performance and low leakage characteristics. The bulk substrate is connected to a supply voltage and forms the drain region of the gain transistor.

A narrow trench is formed through the semiconductor layers, including the bit line layers, into the substrate for forming therein the capacitor storage node of the memory cell. The trench can be formed as deep as desired to attain the requisite capacitance. In addition, with a narrow and deep trench, the capacitance of the storage node can be made large without requiring a significant amount of wafer area.

In one embodiment of the invention, the sidewalls of the trench are oxidized to efficiently form the capacitor dielectric of the storage node, the gate insulator of the gain transistor, and also a lateral insulator for the write bit line. The wafer is further processed to form a vertical polysilicon pass transistor on the inside sidewall of the trench, for connecting the write bit line to the capacitor storage node. In this manner, the charge on the write bit line can be switched through the pass transistor to the semiconductor material of the capacitor storage node. The wafer is again oxidized to insulate an upper portion of the trench for depositing therein a conductive polysilicon word line. The polysilicon word line, together with the upper sidewall oxide, forms a transistor gate structure for the pass transistor. With this memory cell structure, all elements thereof, except for the gain transistor and the buried read bit line, are electrically isolated from the substrate. A cell with a high alpha particle immunity is thus realized.

With the foregoing structure, the gain memory cell of the invention is written by driving the word line to a logic high level which, in turn, drives the pass transistor into conduction. The electrical charge corresponding to a logic zero or one then existing on the write bit line is transferred to the storage node of the capacitor, via the conducting pass transistor. During read operations, the word line is again driven to a logic high level. The series capacitances between the word line and capacitor storage node cause a booting of the storage node voltage with a certain voltage, depending upon the charge stored on the storage node. In the event a charge corresponding to a logic low level is stored in the storage capacitor, the booted voltage of the storage node is insufficient to drive the high threshold gain transistor heavily into conduction, and thus the voltage appearing on the read bit line remains practically at its precharged level. On the other hand, if a charge corresponding to a logic one was stored in the storage node, the booted capacitor voltage increases, thereby driving the gain transistor heavily into conduction. The conductive gain transistor thus connects the read bit line to the bulk substrate which is connected to a logic high voltage, thereby providing an internal readout gain. Hence, the read bit line voltage swing can be greater than in a conventional one-transistor cell, thereby eliminating the need, in many instances, for complex and high performance sense amplifiers.

In the preferred embodiment of the invention, the vertical polysilicon pass transistor is not wholly isolated from the semiconductor substrate, but rather is electrically connected thereto by an annular opening in the trench sidewall oxide. During wafer processing, the polysilicon channel region of the pass transistor is recrystallized, as a result of its contact with the single crystal semiconductor, and converted into a single crystal material. A high performance pass transistor is thus realized. The source and drain regions of the pass transistor remain electrically isolated by the thin sidewall oxide, thereby yet rendering the pass transistor with a high degree of alpha particle immunity.

BRIEF DESCRIPTION OF THE DRAWINGS

Further features and advantages will become more apparent from the following and more particular description of the various embodiments of the invention, as illustrated in the accompanying drawings in which like reference characters generally refer to the same parts, regions or areas throughout the views, and in which:

FIGS. 8–13 are sectional views of a semiconductor wafer in various stages of the construction of the cell of the preferred embodiment of the invention.

DETAILED DESCRIPTION OF THE INVENTION

Figure 1:
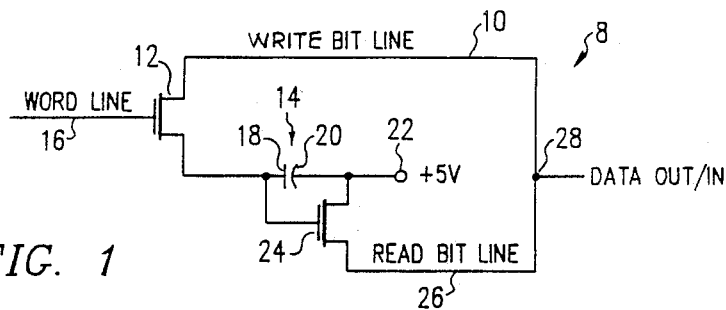
FIG. 1 is an electrical schematic drawing of the gain DRAM cell of the invention.

With reference to FIG. 1, there is schematically illustrated the two-transistor gain DRAM cell 8 of the invention. The cell 8 includes a write bit line 10 connected by an N-channel pass transistor 12 to a storage capacitor 14. The pass transistor 12 is driven by a word line 16 for transferring digital information placed on the write bit line 10 to the storage capacitor 14. The storage capacitor 14 has one plate, or storage node 18, connected to the pass transistor 12, and a second plate 20 connected to a supply voltage 22. In the preferred form of the invention, the supply 22 includes a magnitude of about five volts, and is connected through the bulk of the silicon substrate to the plate 20 of the storage capacitor 14.

Connected across the storage capacitor 14 is a gain transistor 24 for providing an output of the cell 8. The gain transistor 24 includes a gate connected to the storage node 18 of the capacitor 14, and a drain connected to the capacitor plate 20, or substrate, of the cell 8. The gain transistor 24 is further connected to a read bit line 26 to provide an output of the cell 8 during read operations. The write bit line 10 and the read bit line 26 are connected together by a buried connection 28.

In brief summary, the gain cell 8 of FIG. 1 is written with information by driving the word line 16 to a logic high level. The word line signal drives the pass transistor 12 into conduction, thereby connecting the write bit line 10 by a low impedance path to the storage node plate 18 of the storage capacitor 14. As a result, a charge corresponding to a logic zero or a logic one is transferred from the write bit line 10 to the storage capacitor 14. Importantly, the turn-on threshold voltage of the gain transistor 24 is higher than that of the pass transistor 12 so that during write operations the gain transistor 12 is not inadvertently turned on strongly.

A read operation of the gain cell 8 of the invention is accomplished by driving the word line 16 to a logic high level which, according to the invention, raises or boosts the capacitor storage node plate 18 to a voltage level which is a function of the charge stored on such capacitor 14. The read bit line 26 is precharged to about 2.5 volts. The pass transistor 12 is constructed to exhibit a slow response as compared to that of the gain transistor 24. Preferably, the conduction channel of the pass transistor 12 is made substantially longer than that of the gain transistor 24, thus reducing the gain of the pass transistor 12 and rendering it slower in response to electrical signals. The noted response times of the transistors are important to the operation of the cell 8, especially during read operations so that the pass transistor 12 remains nonconductive for a time sufficient to allow the gain transistor 24 to charge up the read bit line 26 when reading a logic one, or to allow the read bit line 26 to remain at the 2.5 volt precharged level when the cell readout is a logic zero. The bit lines are precharged to 2.5 V only prior to the read operation. Otherwise, the bit lines are normally precharged to 5 V to prevent leakage from the substrate 20 (held at 5 V) to the read bit line 26 through the gain transistor 24.

In any event, when the word line 16 is driven to a logic high, the capacitance of the word line 16 is in series with that of the storage capacitor 14, thereby defining a capacitor divider. Thus, when the word line 16 is driven to, for example, five volts, and if substantially no charge is stored on the capacitor 14, the storage node plate 18 of the capacitor 14 will be raised or boosted to a fraction of five volts, depending on the capacitor divider ratio. Because there is substantially no voltage across the storage capacitor 14, the gate to source voltage of the gain transistor 24 does not exceed the threshold voltage and thus such transistor remains substantially in a nonconductive state. As a result, the read bit line 26 remains disconnected from the supply voltage 22, and stays at its precharged level.

On the other hand, during a read operation when the word line 16 is driven to a logic high and if a five volt charge has been stored on the storage capacitor 14, the storage node plate 18 will be boosted to about ten volts, again depending on the capacitor divider ratio. Hence, the storage node plate 18 will be at about a ten volt level, while the other capacitor plate 20 will be at a five volt level. The five volt difference across the storage capacitor 14 exceeds the threshold of the gain transistor 24, whereupon such transistor 24 will be driven heavily into conduction and transfer a substantial charge from the supply voltage 22 to the read bit line 26. In contrast with prior DRAM cells, the gain cell 8 of the invention does not couple charge from the storage capacitor 14 directly onto the read bit line 26, but rather couples electrical charge from the supply 22 through a gain transistor 24 onto the read bit line 26, thereby providing a large signal to sense amplifier circuits. By fabricating the gain cell as a trench structure in a semiconductor substrate, the area of such a cell can be made as small as prior planar-type DRAM cells, despite the addition of the gain transistor 24. Indeed, the invention allows the storage capacitor 14 to made as large as required, without sacrificing substantial wafer area.

Figure 2:
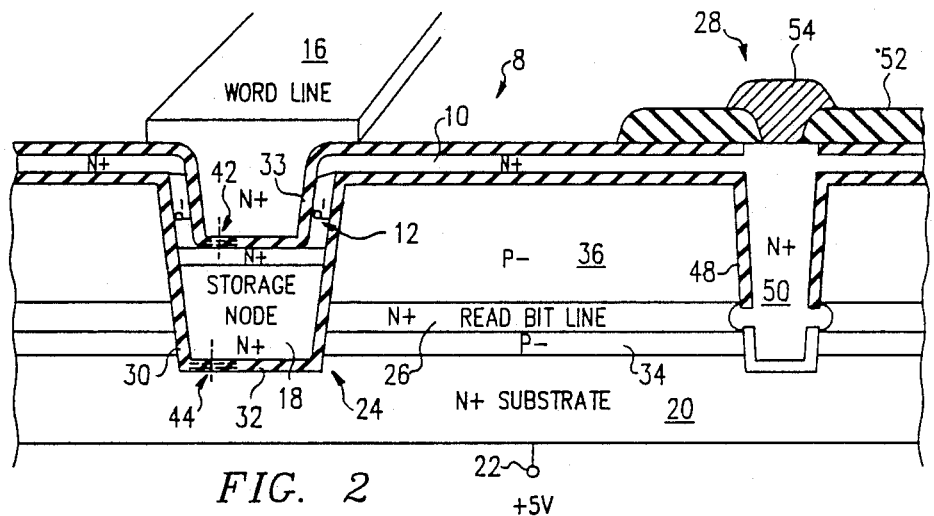
FIG. 2 is a sectional view of a gain DRAM cell according to one embodiment of the invention.

In order to facilitate the understanding of the invention, there is depicted in FIG. 2 a portion of a memory array having one of many trench gain-type DRAM cells. The integrated circuit structure of the gain-type DRAM cell 8 includes a trench 30 formed in a number of layers of semiconductor material, down to the N-type substrate 20. As noted, the substrate 20 is connected by conventional means to a supply of DC voltage 22. The trench 30 has formed on the sidewalls and bottom surface thereof a thin dielectric 32 which also serves as a gate insulator for the gain transistor 24. A substantial part of the trench 30 is filled with a heavily doped semiconductor material forming the storage node 18, or one plate of the storage capacitor 14. The other plate of the capacitor comprises the semiconductor substrate 20 which is separated from the storage node plate 18 by the thin electrical insulating dielectric 32. A conformal layer of polysilicon is doped or implanted to form the vertical pass transistor 12 and the write bit line 10. The wafer is again oxidized to form a gate insulator 33 for the pass transistor 12. The top of the trench 30 is filled with a heavily doped polysilicon, forming the word line 16.

A number of layers of semiconductor material formed on the substrate 20 define the various elements of the gain transistor 24, as well as the read bit line 26. A lightly doped P-type semiconductor layer 34 forms the conduction channel of the gain transistor 24. The heavily doped N+ read bit line 26 and the heavily doped N+ substrate 20 form the respective source and drain regions of the gain transistor 24. The thin dielectric 32 defines the gate insulator of the gain transistor 24 and the storage node 18 defines the gate conductor. Formed on the read bit line 26 is another lightly doped P-type semiconductor layer 36. The thin dielectric 33 defines the gate insulator of the pass transistor 12, while the heavily doped N+ word line 16 defines the gate conductor thereof. The thin dielectric 33 also provides electrical isolation between the capacitor storage node 18 and the word line 16, such elements defining a capacitor 42 shown in broken lines. Capacitor 42 is in series with the cell storage capacitance, which is shown in broken lines as reference character 44. As noted above, the series connection of capacitors 42 and 44 are essential to the operation of the gain DRAM cell of the invention.

The write bit line 10 and the read bit line 26 are connected at a location remote from the cell 8 by any conventional technique, such as the trench connection 28. The trench connection 28 includes a dielectric lined trench 48 filled with a conductive material 50, such as a heavily doped polysilicon. The dielectric is removed at sidewall locations corresponding to the write bit line 10 and the read bit line 26, through which electrical connections are made to the conductive material 50 filling the trench 48. The conductive material extending between the conductive trench material 50 and the respective write bit line 10 and read bit line 26 is fabricated by forming annular cutouts through the trench insulation 49, filling the trench with a conductive polysilicon, and outdiffusing the impurities into the bit line channels to provide electrical continuity therebetween. Illustrated is passiviting layer 52 covering the surface of the wafer, and an opening formed therein through which a metal contact 54 is formed in contact with the conductive trench filling 50. With such an arrangement, a connection can be made to contact 54 for reading and writing the gain DRAM cell 8 via the write bit line 10 and the read bit line 26. Precharging of the read and write bit lines can also be accomplished via the contact 54. Adjacent bit lines of adjacent cells are laterally isolated by deep trench grooves filled with an oxide.

Figure 3:
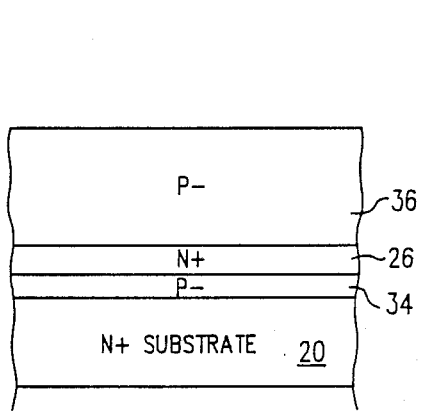
FIGS. 3–7 are sectional views of a semiconductor wafer in various stages of the construction of the cell of FIG. 2.

Having described the general construction and operation of the gain DRAM cell 8 of the invention, the fabrication steps thereof are next described in detail. As shown in FIG. 3, the fabrication commences by selecting a semiconductor substrate 20 suitably doped with an N-type impurity to provide a highly conductive substrate. The substrate 20 can be doped with phosphorus at a concentration of about 1E19 atom per cm$^3$. Next, an epitaxial layer 34 of silicon material is deposited on the substrate 20. The epitaxial layer 34 may be deposited in situ as a semiconductor material lightly doped with a P-type impurity, or deposited and doped thereafter by diffusion or ion implant techniques. Layer 34 may be doped with a P-type impurity such as boron. Since the lightly doped P- layer 34 defines the conduction channel of the gain transistor 24, such layer 34 can be appropriately doped to achieve a desired threshold of such transistor. Preferably, a threshold of about 1–1.5 volts is desirable. In addition, the depth of the epitaxial layer 34 corresponds to the channel length of the gain transistor 24 which, according to the preferred form of the invention, should be short. For a high gain MOS transistor, the channel length should be short. Accordingly, the epitaxial layer 34 is formed with a thickness of about one micron.

Deposited on top of the P-type epitaxial layer 34 is another epitaxial layer of silicon material which forms the read bit line 26. The epitaxial layer 26 is heavily doped with an N-type impurity, such as phosphorus. The read bit line epitaxial layer 26 is rather shallow, about 1.5 microns thick. However, the read bit line 26 should exhibit low resistance, and thus the lateral width of the read bit line 26 may have the same dimension as the trench 30.

Next, an additional epitaxial layer 36 of a P-type material is deposited on the read bit line layer 26. The P-type layer 36 is deposited to form a thickness sufficient to etch a trench therethrough of a desired depth. A thickness of semiconductor layer 36 of about four to five microns is adequate for typical trench depths. Significantly, an epitaxial layer 36 of single crystal semiconductor material facilitates the fabrication of a high quality pass transistor 12, as described below in connection with the preferred embodiment of the invention. By fabricating the pass transistor 12 and the gain transistor 24 with single crystal silicon epitaxial material, high quality and low leakage transistors can be obtained. As noted above, it is significant that the pass transistor 12 be substantially slower in response than the gain transistor 24. The low gain characteristics of the pass transistor 12 achieve the slow response characteristics.

Figure 4:
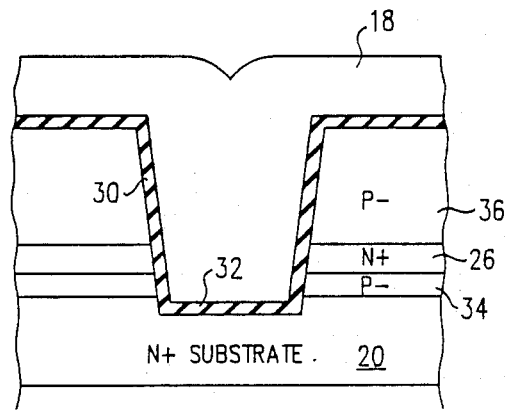

The layered semiconductor structure is readied for further processing by depositing a layer of oxide and/or photoresist (not shown) thereover and patterning it to define an opening for a trench 30. The wafer is then subjected to an anisotropic etch, such as a plasma reactive ion etch (RIE), to remove the semiconductor material in the opening and to remove such material in a downward direction. As depicted in FIG. 4 the anisotropic etch process is continued until a trench 30 of about eight microns deep is formed down into the substrate 20. After the photoresist and/or oxide mask material is removed, a layer of silicon oxide 32 is then formed over the surface of the wafer by subjecting the wafer to a silicon oxidizing ambient. The silicon oxide layer 32 defines the capacitor dielectric 32, and thus should be somewhat thin. Preferably, the silicon material 32 is oxidized until about 100-150 angstroms of silicon oxide have been grown. The insulating oxide layer 32 also serves to insulate the write bit line 10 formed thereover from the underlying substrate layer 36. Next, and as further noted in FIG. 4, a layer of highly doped polysilicon is deposited over the surface of the wafer to form the storage node 18 of the capacitor. The polysilicon 18 is doped to a high concentration 1E19 of, for example, a phosphorus impurity to form an N+ conductive region.

Figure 5:
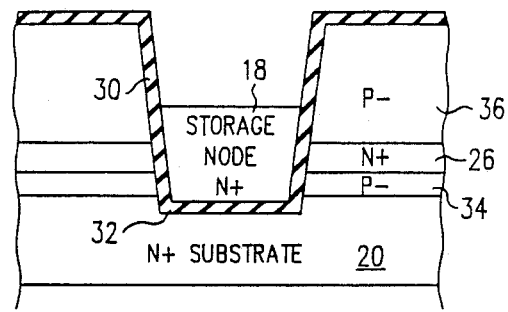

The wafer is then appropriately etched to remove the surface polysilicon, thereby leaving that which is deposited in the lower portion of the trench 30. This is shown in FIG. 5 of the drawings.

Figure 6:
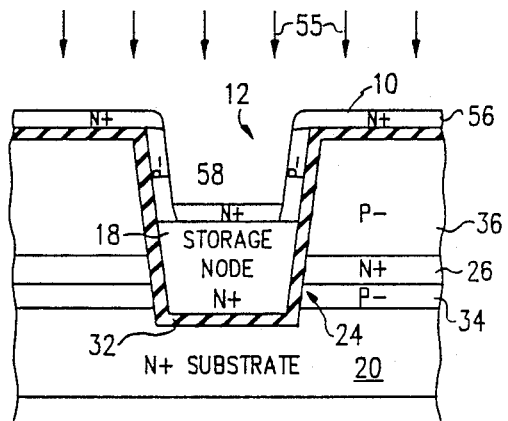

As shown in FIG. 6, a conformal layer 56 of a lightly P-type doped polysilicon is then deposited over the surface of the wafer, to a thickness of about 1000 angstroms. The wafer is then subjected to an ion implant 55 with an N-type impurity. The lateral areas of the P-type polysilicon layer 56 are thus counter-doped and converted into N+ semiconductor areas. The N+ region 10 defines the write bit line of the cell, as well as the drain region of the pass transistor 12. The N+ region 58 defines the source region of the pass transistor 12. As noted in the drawing, the source region 58 is in electrical contact with the storage node 18. As can be realized, the pass transistor 12 is effective to connect the write bit line 10 with the storage node 18 of the capacitor 14.

It will also be appreciated that the channel length of the pass transistor is related to the vertical sidewall dimension of the trench 30 above the storage node 18. Hence, by forming a deep trench 30 and filling it to a desired depth with the storage node material 18, the vertical channel length of the pass transistor 12 becomes defined. Because the pass transistor 12 preferably has a low gain, the channel length should be rather long. In order to make the gain of the pass transistor 12 smaller than that of the gain transistor 24, the pass transistor channel length should be about three microns. As a result, the electrical response of the pass transistor 12 is also slower than that of the gain transistor 24. The threshold voltage of the pass transistor 12 should also be lower than that of the gain transistor 24. To that end, the impurity concentration of the polysilicon layer 56 can be adjusted to achieve an impurity level in the pass transistor channel to achieve a desired threshold voltage. Preferably, a pass transistor threshold voltage of about one volt is desirable.

Figure 7:
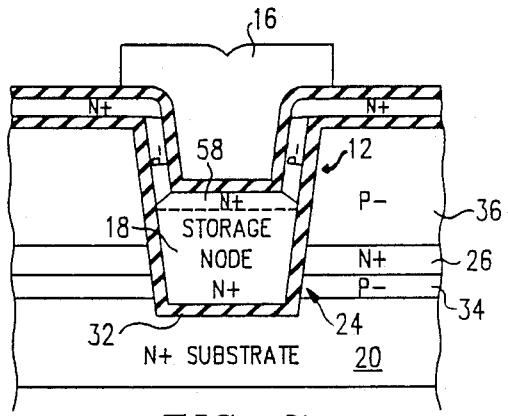

As shown in FIG. 7, the wafer is again subjected to a silicon oxidizing ambient, in which a layer 33 of silicon oxide is formed. The silicon oxide layer 33 defines a capacitor dielectric between the word line 16 and the storage node 18, as well as the gate oxide of the pass transistor 12. The silicon oxide dielectric 33 is grown to a thickness of about 250 angstroms. During the oxidizing step in which the dielectric layer 33 is formed, the impurities of the polysilicon storage node 18 diffuse upwardly into the N+ polysilicon layer 58. When so formed, the semiconductor material and impurity type of the region 58 are homogeneous with that of the capacitor storage node 18, such regions thereby being electrically connected together.

A layer 16 of N+ doped polysilicon is next deposited over the surface of the wafer, to a depth sufficient to fill the remainder of the trench 30. The polysilicon layer 16 is heavily doped with an N-type impurity, sufficient to form a conductive word line of the cell 8. The polysilicon layer 16 is patterned and etched to define a word line connecting together a number of similar gain-type memory cells of the invention.

As can be appreciated from the foregoing, the two-transistor gain cell of the invention can be construction with relatively few process steps. In addition, the fabrication of the gain cell provides the flexibility for achieving various parameters. For example, the channel length of the pass transistor can be made of a desired length by altering the amount by which the N+ storage node is etched. The etch-back of the N+ polysilicon material can be controlled by the etch-back time, or other characteristics of the etching process. In accordance with an important technical advantage of the invention, the gain cell is substantially surrounded by an electrical insulating material to provide a high degree of soft error immunity to alpha particles which may enter the substrate. An additional technical advantage presented by the invention is that the electrical insulating material also isolates the write bit line from the substrate, thereby also enhancing the soft error immunity of an array of such cells. Yet another technical advantage of the invention is that the write bit line, being insulated from the underlying substrate, exhibits less capacitance and can thereby be driven with high speed signals.

The performance of the DRAM cell described in connection with FIGS. 2-7 can be further improved in accordance with the preferred embodiment of the invention, illustrated below in FIGS. 8-13. In this embodiment, the performance of the gain cell is improved by providing a pass transistor constructed with single crystal silicon material. As described below, the semiconductor channel region of the pass transistor is formed in electrical contact through an annular opening in the trench with the surrounding single crystal P- semiconductor material. During fabrication of the cell, the polycrystalline silicon channel region and surrounding P- single crystal silicon is heated to a temperature sufficient to convert the polycrystalline channel material into a single crystal silicon material. As is well known in the art, transistors fabricated with single crystal silicon material exhibit superior electrical characteristics as compared to polysilicon-type transistors. A further technical advantage of the preferred gain cell of the invention is that the source and drain regions of the pass transistor are electrically insulated from the surrounding P- silicon substrate material, thereby providing enhanced soft error immunity to the cell. The electrical operation of the gain cell according to the preferred embodiment of the invention functions, in terms of read and write operations, substantially identical to that shown in FIG. 2. FIGS. 8-13 illustrate various cross-sectional views of a wafer during the major steps in fabricating a gain-type DRAM cell having a high immunity to soft errors, as well as a high quality pass transistor.

The fabrication of the gain DRAM cell according to the preferred embodiment of the invention begins with a N+ substrate 20, a lightly doped P- layer 34, a heavily doped N+ epitaxial layer 26, and a lightly doped P- epitaxial layer 36, all constructed in a manner similar to that shown in FIG. 3. However, formed over the epitaxial layer 36 is a layer 64 of silicon oxide for insulating an overlying write bit line 66 from the semiconductor substrate. The silicon oxide layer 64 is formed by subjecting the wafer to a silicon oxidizing ambient in which 3,000–4,000 angstroms of silicon oxide are grown. The write bit line 66 is formed by depositing a relatively thick layer of doped polysilicon over the surface of the wafer, and patterning it to form the bit lines connecting together other cells of similar construction. The write bit line 66 is doped sufficiently with an N-type impurity to provide a low resistance conductor.

Processing of the wafer continues by masking the wafer with a photoresist and/or oxide to define an opening for a trench. After such masking, the wafer is subjected to an anisotropic reactive ion etch, or other similar etch, for forming a trench 68 through various layers of the wafer, and partially into the N+ substrate 20. This is shown in FIG. 9. A trench of about eight microns deep is sufficient to form therein the major components of the gain DRAM cell of the invention. Conventional dry etches of the noted type are available for etching through the various semiconductor and silicon oxide layers of the wafer. Next, a thin insulating dielectric 70 is formed over the surface of the wafer, including the sidewalls of the trench 68, to define a capacitor dielectric located between the N+ storage node 18 and the N+ substrate 20. The silicon oxide layer 70 is grown to a thickness of about 100-150 angstroms.

A thick layer of heavily doped N+ polysilicon is then deposited over the wafer. The polysilicon is etched by an anisotropic RIE etch to remove the surface polysilicon, as well as that within the upper portion of the trench, as shown in FIG. 9.

With reference now to FIG. 10, there is illustrated the wafer after having been subjected to a wet etch to selectively remove the exposed silicon oxide 70. The wet etch may be accomplished employing a buffered hydrofluoric (HF) solution which is effective to selectively remove the exposed thin silicon oxide layer 70, without affecting the underlying silicon material.

A second polysilicon etch is conducted, as illustrated in FIG. 11. The second polysilicon etch may also be of the RIE type, for further removing a small amount of the silicon material comprising the N+ storage node 18. Such an etch can be designed to remove the storage node material 18, without affecting the remaining thin silicon oxide dielectric 70. As noted, the silicon oxide dielectric 70 formed on the trench sidewalls extends upwardly beyond the upper surface of the capacitor storage node material 18.

FIG. 12 depicts the wafer after the second polysilicon etch, and after a conformal layer 72 of P-type doped polysilicon has been deposited over the surface of the wafer. The polysilicon layer 72 provides the semiconductor medium in which the pass transistor is formed on the internal sidewalls of the trench 68. As can be appreciated, because the conformal polysilicon layer 72 covers all four sidewalls of the trench, the pass transistor is also formed around the periphery of the trench 68.

The wafer is again subjected to a silicon oxidizing environment for growing a thin layer of silicon oxide 74, as illustrated in FIG. 13. Such layer 74 is formed to a thickness of about 150-200 angstroms to define a gate insulator for the pass transistor 76. The silicon oxidation can be conducted at a temperature of about 850°-900° C., which temperature also causes an up-diffusion of the N-type impurities from the polysilicon layer 66 into the overlying polysilicon layer 72 formed in contact therewith. Conductive semiconductor layers 66 and 72 essentially become one large conductor defining the write bit line. The impurities diffused from layers 66 into 72 are also effective to form an N+ semiconductor drain region for the vertical pass transistor 76.

The same type of up-diffusion occurs from the N+ storage node 18 into the conformal polysilicon deposited under the contoured bottom of the silicon oxide layer 74. The up-diffusion in such area is effective to form a semiconductor source region 80 for the pass transistor 76. The P- polysilicon material remaining between the semiconductor drain region 78 and the semiconductor source region 80 defines the channel region 82 of the vertical pass transistor 76. Importantly, during the silicon oxidizing step, a regrowth of the polysilicon in the pass transistor channel region 82 occurs, in which such material is converted into a high quality single crystal silicon transistor conduction channel 82. This occurs as a result of the polysilicon channel material 82 being in intimate contact with the single crystal P- silicon layer 36. In this manner, the single crystal silicon layer 36 functions as a seed for recrystallizing the polysilicon channel material during the thermal oxidizing cycle. The wafer may undergo an optional high temperature anneal to assure that the channel material is completely recrystallized into single crystal silicon material. As a result, a high quality pass transistor 76 is formed which exhibits low leakage characteristics, and thus reduces cell refresh requirements.

In accordance with another important aspect of the invention, the semiconductor drain region 78 and source region 80 are shielded by electrical insulators from that portion of the silicon substrate lying outside of the trench 68. Particularly, the semiconductor drain region 78 is shielded from the P- semiconductor layer 36 by the thick silicon oxide layer 64. In like manner, the pass transistor source region 80 is shielded by the capacitor dielectric 70 from the P- semiconductor layer 36. As a result, alpha particles which pass through the P- layer 36 do not affect the electrical state of the transistor drain and source regions 78 and 80. In addition, because of electrical isolation, the electron and hole pairs created in the P- layer 36 by alpha particles also do not disturb the electrical state of the write bit line 66 or the capacitor storage node 18. A gain DRAM cell having high performance characteristics and soft error immunity is thereby achieved.

The fabrication of the gain DRAM cell of the invention is completed by depositing a layer of highly doped polysilicon over the wafer to form the word lines of the array. The polysilicon is masked and patterned to define the word line 84, shown in FIG. 13. The conductive word line 84 also defines the gate conductor for the pass transistor 76 which, together with the gate insulator 74, is effective to invert the transistor channel 82 when such word line is driven with logic high signals. Of course, the write bit line 66 and the read bit line 26 may be connected together by the buried contact 28, as described above in connection the embodiment of FIG. 2.

From the foregoing, disclosed is a trench-type gain DRAM cell which achieves many advantages not realized by DRAM cells heretofore known. A major technical advantage presented by the invention is that a DRAM cell can be efficiently constructed having a high immunity to the effects of alpha particle strikes in the substrate. An additional technical advantage of the invention is that the pass transistor is fabricated of single crystal silicon material, thereby providing a high quality transistor with low leakage characteristics. This is accomplished by initially forming the transistor of polysilicon, and then converting it to single crystal form. The advantage flowing from this construction is that intervals between refresh periods can be increased, thereby requiring less refresh cycles over a period of time.

Therefore, while the preferred embodiment of the invention has been disclosed with reference to a particular gain-type DRAM cell, it is understood that many changes in detail may be made as a matter of engineering choices without departing from the spirit and scope of the invention, as defined by the appended claims.

What is claimed is:

1. A trench DRAM device comprising:
a semiconductor structure having at least three semiconductor layers of alternating conductivity type;
a trench in said semiconductor structure extending through at least one of said semiconductor layers and ending in another of said semiconductor layers;
a write bit line lying over and insulated from said semiconductor structure and extending at least to said trench;
a read bit line comprising a first layer of said at least three semiconductor layers;
a word line lying above said semiconductor structure and over said trench;
a pass transistor located substantially within said trench having a gate comprising said word line, a first source/drain region comprising said write bit line, a channel, and a second source/drain region;
a vertical gain transistor located substantially outside said trench, having a gate within said trench, a third source/drain region comprising said read bit line, a channel comprising a second layer of said more than one semiconductor layer, and a fourth source/drain comprising a third layer of said at least three semiconductor layers; and
a capacitor having a storage node within said trench comprising said gate of said vertical gain transistor and a fixed node located outside of said trench comprising said fourth source/drain region.

2. The trench DRAM device of claim 1 wherein:
said semiconductor structure comprises single crystal silicon.

3. The trench DRAM device of claim 2 wherein:
said channel of said pass transistor is single crystal silicon.

4. The trench DRAM device of claim 1 wherein:
said third source/drain region, said fourth source/drain region, and said channel of said vertical gain transistor are located along a wall of said trench and within said semiconductor structure.

5. The device of claim 1 wherein:
said channel of said pass transistor is longer than said channel of said gain transistor.

6. A trench DRAM device comprising:
a semiconductor structure having a plurality of semiconductor layers of alternating conductivity type;
a trench in said semiconductor structure extending through at least one of said layers and ending in another of said layers;
a pass transistor having a gate, a source, a drain, and a channel region all formed inside of said trench;
a gain transistor having a source, a drain, and a channel formed outside of said trench within said semiconductor structure and a gate formed inside of said trench; and, a capacitor having a storage node formed inside said trench, a second node formed outside of said trench in said semiconductor structure, and a dielectric between said storage node and said second node;
wherein said gate of said pass transistor is also a word line of said device, one of said source and said drain of said pass transistor is connected electrically to said storage node of said capacitor and to said gate of said gain capacitor, and the other of said source and said drain of said pass transistor is also a write bit line of said device; and,
wherein said second node of said capacitor is electrically connected to a supply voltage and is also one of said source and said drain of said gain transistor and the other of said source and said drain of said gain transistor is also a read bit line of said device.

7. The trench DRAM device of claim 6 wherein:
said channel region of said pass transistor is single crystal silicon.

8. The trench DRAM device of claim 6 wherein:
said read bit line is a layer of said plurality of semiconductor layers within said semiconductor structure.

9. The trench DRAM device of claim 6 wherein:
said channel of said pass transistor is longer than said channel of said gain transistor.

* * * * *